United States Patent
Koda et al.

(10) Patent No.: US 12,500,185 B2
(45) Date of Patent: Dec. 16, 2025

(54) SEMICONDUCTOR DEVICE

(71) Applicant: Mitsubishi Electric Corporation, Tokyo (JP)

(72) Inventors: Kazuki Koda, Tokyo (JP); Shuhei Yokoyama, Tokyo (JP); Naoki Ikeda, Tokyo (JP); Shogo Shibata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 532 days.

(21) Appl. No.: 18/048,483

(22) Filed: Oct. 21, 2022

(65) Prior Publication Data
US 2023/0230940 A1    Jul. 20, 2023

(30) Foreign Application Priority Data

Jan. 19, 2022 (JP) .................... 2022-006364

(51) Int. Cl.
*H01L 23/495* (2006.01)
*H01L 23/31* (2006.01)
(Continued)

(52) U.S. Cl.
CPC ............ *H01L 23/60* (2013.01); *H01L 23/315* (2013.01); *H01L 23/49537* (2013.01);
(Continued)

(58) Field of Classification Search
CPC . H01L 23/60; H01L 23/315; H01L 23/49537; H01L 23/49562;
(Continued)

(56) References Cited

U.S. PATENT DOCUMENTS

2003/0075783 A1* 4/2003 Yoshihara ......... H01L 23/49575
                                                           257/E23.092
2019/0305689 A1* 10/2019 Ando .................... H02M 7/537
(Continued)

FOREIGN PATENT DOCUMENTS

JP    H06-210678 A    8/1994
JP    2003-124437 A   4/2003
(Continued)

OTHER PUBLICATIONS

Kawato; JP 2009283478 A Google Patents Translation; 2009 (Year: 2009).*

(Continued)

*Primary Examiner* — Omar F Mojaddedi
(74) *Attorney, Agent, or Firm* — Studebaker Brackett PLLC

(57) ABSTRACT

A semiconductor device includes: semiconductor elements; a package sealing the semiconductor elements and being rectangular in a top view; control terminals protruding from a first side of the package; output terminals protruding from a second side facing the first side of the package; and a recessed portion formed in a third side adjacent to the first side and the second side of the package, wherein a part of the control terminals is disposed at end portions of lead frames, the semiconductor device further includes dummy terminals disposed at other end portions of the lead frames, respectively, the dummy terminals protruding from the recessed portion, and an amount of the protrusion of each of the dummy terminals from the recessed portion is smaller than or equal to 0.75 mm.

10 Claims, 4 Drawing Sheets

(51) Int. Cl.
*H01L 23/60* (2006.01)
*H01L 25/16* (2023.01)
*H01L 25/18* (2023.01)
*H01L 23/00* (2006.01)

(52) U.S. Cl.
CPC ........ *H01L 23/49562* (2013.01); *H01L 25/16* (2013.01); *H01L 24/48* (2013.01); *H01L 2224/48137* (2013.01); *H01L 2224/48245* (2013.01); *H01L 2924/1203* (2013.01); *H01L 2924/13055* (2013.01)

(58) Field of Classification Search
CPC ........... H01L 23/49541; H01L 23/3107; H01L 23/49575; H01L 24/48; H01L 24/45; H01L 24/49; H01L 25/16; H01L 25/072; H01L 25/18
See application file for complete search history.

(56) References Cited

U.S. PATENT DOCUMENTS

| | | | |
|---|---|---|---|
| 2021/0375728 | A1 | 12/2021 | Yokoyama et al. |
| 2022/0020730 | A1* | 1/2022 | Katoh ................ H01L 23/473 |
| 2022/0077036 | A1* | 3/2022 | Matsubara ........ H01L 23/49575 |

FOREIGN PATENT DOCUMENTS

| | | |
|---|---|---|
| JP | 2004-119579 A | 4/2004 |
| JP | 2009-111154 A | 5/2009 |
| JP | 2009283478 A * | 12/2009 |
| JP | 2021-190607 A | 12/2021 |
| WO | 2018/003827 A1 | 1/2018 |
| WO | 2019/216159 A1 | 11/2019 |

OTHER PUBLICATIONS

"Notice of Reasons for Refusal" Office Action issued in JP 2022-006364; mailed by the Japanese Patent Office on Oct. 1, 2024.

* cited by examiner

SEMICONDUCTOR DEVICE

BACKGROUND OF THE INVENTION

Field of the Invention

The present disclosure relates to a semiconductor device.

Description of the Background Art

Conventional semiconductor devices include a semiconductor device including dummy terminals not used as lead terminals but disposed on a short side of a mold resin. These dummy terminals prevent lead frames from becoming deformed when semiconductor elements are die-bonded to the lead frames (for example, see Japanese Patent Application Laid-Open No. 2009-111154 hereinafter referred to as Patent Document 1).

In the semiconductor device described in Patent Document 1, the dummy terminals on the short side of the mold resin are disposed in portions contoured in a module-internal direction so that the dummy terminals can be cut short.

According to the technology described in Patent Document 1, however, the hands tend to come in contact with the dummy terminals when the semiconductor device is mounted by the hands. This is because the dummy terminals protrude even to the vicinity of an end face of the mold resin. When the hands come in contact with the dummy terminals, static electricity is applied to the dummy terminals. This could lead to a failure in the semiconductor device.

SUMMARY

The object of the present disclosure is to provide a technology that can, when a semiconductor device is mounted by the hands, prevent the hands from coming in contact with a dummy terminal and prevent static electricity from being applied to the dummy terminal.

A semiconductor device includes: a plurality of semiconductor elements; a package sealing the plurality of semiconductor elements, the package being rectangular in a top view; a plurality of control terminals protruding from a first side of the package; a plurality of output terminals protruding from a second side facing the first side of the package; and a recessed portion formed in a third side adjacent to the first side and the second side of the package, wherein a part of the plurality of control terminals is disposed at one end portion of a first lead frame, the semiconductor device further includes a dummy terminal disposed at an other end portion of the first lead frame, the dummy terminal protruding from the recessed portion, and an amount of the protrusion of the dummy terminal from the recessed portion is smaller than or equal to 0.75 mm.

Even when the surrounding area of the recessed portion in the package is grasped by either hand, this structure ensures a sufficient distance between the hand and the dummy terminal. When the semiconductor device is mounted by the hands, this structure can further prevent the hands from coming in contact with the dummy terminal, and prevent static electricity from being applied to the dummy terminal.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment

A semiconductor device according to an embodiment will be described.
[Structure of Semiconductor Device]

A semiconductor device according to the embodiment includes, on lead frames, power chips (for example, switching elements), diode elements, and integrated circuits (ICs). The semiconductor device is sealed by transfer molding, and is a semiconductor device for high power. A mold resin is rectangular in a top view. Terminals are disposed on two facing sides among four sides. Control terminals and output terminals are separately disposed on the two facing sides. In addition, terminals shorter than the control terminals and output terminals are disposed on a side other than these two sides.

Figure 1:
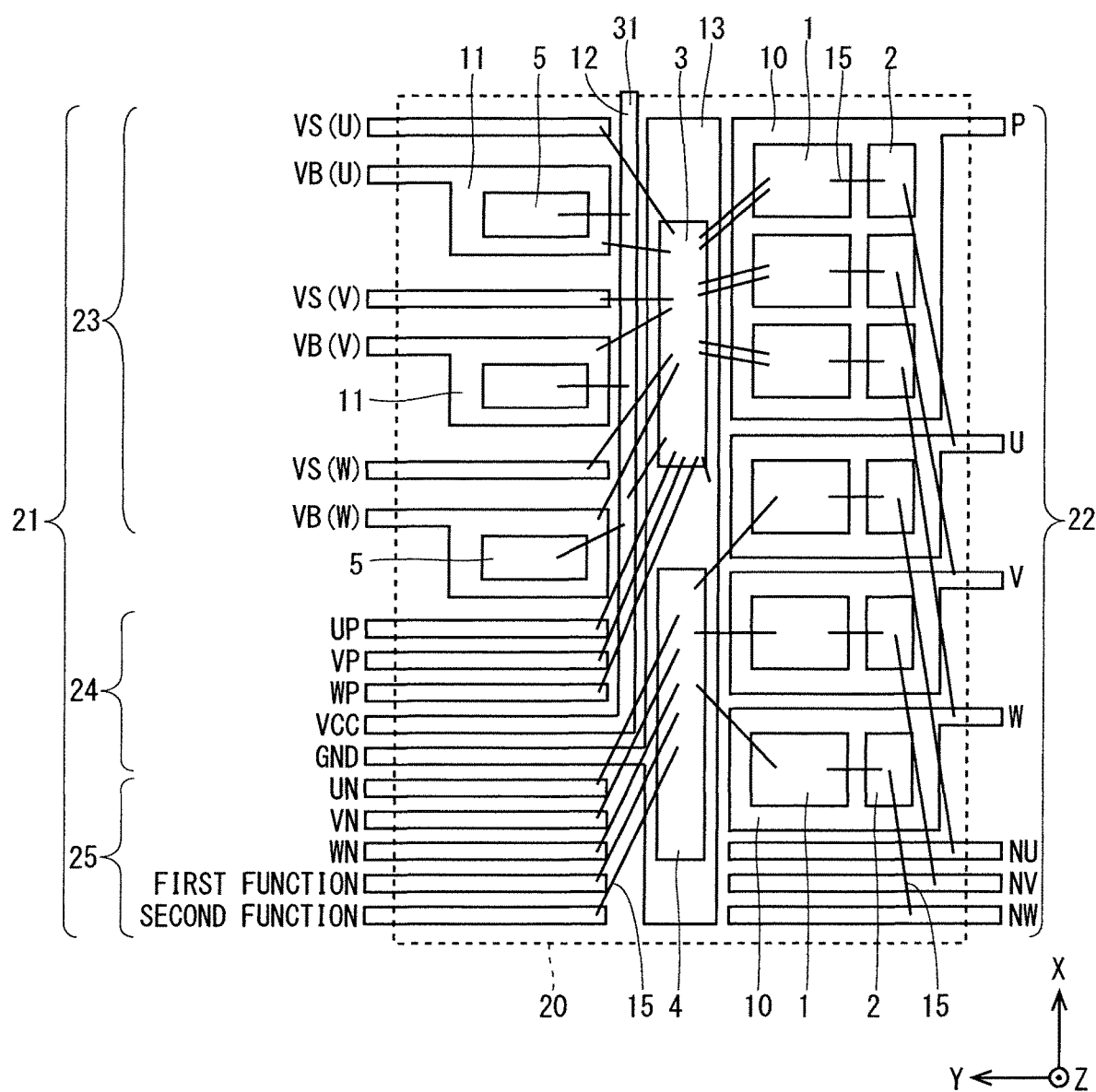
FIG. 1 is a top view illustrating an internal structure of a semiconductor device according to an embodiment.

FIG. 1 is a top view illustrating an internal structure of the semiconductor device according to the embodiment.

In FIG. 1, the X direction, the Y direction, and the Z direction are orthogonal to one another. The X direction, the Y direction, and the Z direction in the following diagrams are also orthogonal to one another. In the following description, a direction including the X direction and −X direction that is a direction opposite to the X direction will be also referred to as an x-axis direction. In the following description, a direction including the Y direction and −Y direction that is a direction opposite to the Y direction will be also referred to as a y-axis direction. In the following description, a direction including the Z direction and −Z direction that is a direction opposite to the Z direction will be also referred to as a z-axis direction.

As illustrated in FIG. 1, the semiconductor device incudes six power chips 1, six diodes 2, three boot strap diodes 5, a high-voltage IC 3, a low-voltage IC 4, four lead frames 10, three lead frames 11, a lead frame 12, a lead frame 13, a package 20 that is the mold resin, a plurality of control terminals 21, a plurality of output terminals 22, a dummy terminal 31 that is a short terminal, and wire 15 connecting these elements.

The power chips 1 are switching elements such as an insulated-gate bipolar transistor (IGBT). Here, the six power chips 1, the six diodes 2, and the three boot strap diodes 5 correspond to a plurality of semiconductor elements. The power chips 1 will be also referred to switching elements, and the diodes 2 and the boot strap diodes 5 will be also referred to diode elements.

The plurality of semiconductor elements may contain not only Si but also, for example, wide bandgap semiconductors such as SiC and GaN as semiconductor materials.

As illustrated in FIG. 1, the package 20 seals the six power chips 1, the six diodes 2, the three boot strap diodes 5, the high-voltage IC 3, the low-voltage IC 4, the four lead frames 10, the three lead frames 11, the lead frame 12, and the lead frame 13, and is formed into a rectangle in a top view.

The package 20 has a first side (a side in the Y direction), a second side facing the first side (a side in the −Y direction), a third side (a side in the X direction) adjacent to the first side (side in the Y direction) and the second side (side in the −Y direction), and a fourth side (a side in the −X direction) facing the third side (side in the X direction). The plurality of control terminals 21 protrude from the first side (side in the Y direction). The plurality of output terminals 22 protrude from the second side (side in the −Y direction).

The three power chips 1 and the three diodes 2 are mounted on the lead frame 10 with a P output terminal at one end portion. The three power chips 1 are connected to the three diodes 2 and to the high-voltage IC 3 through the wire 15. Each of the three diodes 2 is connected to one of a U output terminal, a V output terminal, and a W output terminal through the wire 15.

Pairs of the remaining three power chips 1 and the remaining three diodes 2 are mounted on the lead frames 10 with the U output terminal, the V output terminal, and the W output terminal at end portions. The three power chips 1 are connected to the three diodes 2 and to the low-voltage IC 4 through the wire 15. Each of the three diodes 2 is connected to one of an NU output terminal, an NV output terminal, and an NW output terminal through the wire 15.

Each of the three boot strap diodes 5 is mounted on one of the lead frames 11 with a VB (U) control terminal, a VB (V) control terminal, and a VB (W) control terminal at end portions. The three boot strap diodes 5 are connected to the lead frame 12 through the wire 15. The lead frames 11 are connected to the high-voltage IC 3 through the wire 15. Here, the lead frames 11 correspond to second lead frames.

The high-voltage IC 3 and the low-voltage IC 4 are mounted on the lead frame 13. A UP control terminal, a VP control terminal, and a WP control terminal are connected to the high-voltage IC 3 through the wire 15. Furthermore, a UN control terminal, a VN control terminal, a WN control terminal, a first function control terminal, and a second function control terminal are connected to the low-voltage IC 4 through the wire 15.

As described above, each of the three boot strap diodes 5 is mounted on one of the lead frames 11 with the VB (U) control terminal, the VB (V) control terminal, and the VB (W) control terminal at the end portions in the plurality of control terminals 21 disposed on the first side (side in the Y direction) of the package 20. The VB (U) control terminal, the VB (V) control terminal, and the VB (W) control terminal receive the highest voltages among those of the control terminals. A VS (U) control terminal, a VS (V) control terminal, and a VS (W) control terminal are disposed next to the VB (U) control terminal, the VB (V) control terminal, and the VB (W) control terminal, respectively. The plurality of control terminals 21 include high-potential control terminals 23, and low-potential control terminals that receive voltages lower than those of the high-potential control terminals 23. The VB (U) control terminal, the VB (V) control terminal, the VB (W) control terminal, the VS (U) control terminal, the VS (V) control terminal, and the VS (W) control terminal are the high-potential control terminals 23.

The high-potential control terminals 23 are electrically connected, through the wire 15, to the high-voltage IC 3 that is a control IC that controls high potentials. A high reference potential is applied to the VS control terminals. A driving power potential is applied to the VB control terminals. The semiconductor device according to the embodiment is a semiconductor device that controls three phases of a U-phase, a V-phase, and a W-phase. The semiconductor device includes three pairs of the VS control terminals and the VB control terminals. The high-potential control terminals 23 are terminals to which high voltages are applied. It is preferred that a set of six of the high-potential control terminals 23 is disposed at one end of the first side (side in the Y direction) of the package 20 to ensure insulation distances. Distances between the terminals in boundaries between the U-phase, the V-phase, and the W-phase are increased because potential differences between these phases are significant.

First low-potential control terminals 24 are disposed next to the high-potential control terminals 23 in another end of the first side (side in the Y direction) except the end with the high-potential control terminals 23, that is, an end of the first side (side in the Y direction) in which the high-potential control terminals 23 are not disposed. The first low-potential control terminals 24 consist of the UP control terminal, the VP control terminal, the WP control terminal, a VCC control terminal, and a GND control terminal, and are terminals that receive voltages lower than those of the high-potential control terminals 23.

The UP control terminal, the VP control terminal, and the WP control terminal are connected to the high-voltage IC 3 through the wire 15. The VCC control terminal is disposed at one end portion of the lead frame 12. The dummy terminal 31 is disposed at the other end portion of the lead frame 12. The GND control terminal is disposed at one end portion of the lead frame 13 on which the high-voltage IC 3 and the low-voltage IC 4 are mounted.

Second low-potential control terminals 25 are disposed at yet another end of the first side (side in the Y direction) except the end with the first low-potential control terminals 24. The second low-potential control terminals 25 are electrically connected to the low-voltage IC 4 through the wire 15. The second low-potential control terminals 25 may include a control terminal that is connected to neither the high-voltage IC 3 nor the low-voltage IC 4, which is not illustrated. Here, the control terminal connected to neither the high-voltage IC 3 nor the low-voltage IC 4 should be disposed at one of the positions of the second low-potential control terminals 25.

The first low-potential control terminals 24 and the second low-potential control terminals 25 differ from the high-potential control terminals 23 in the following two points. First, the first low-potential control terminals 24 and the second low-potential control terminals 25 are disposed at intervals shorter than the distances between the terminals in the boundaries of the phases of the high-potential control terminals 23. Next, voltages to be applied to the first low-potential control terminals 24 and the second low-potential control terminals 25 are lower than those of the high-potential control terminals 23.

The lead frame 12 with the VCC control terminal that is one of the first low-potential control terminals 24 extends inside the package 20 to the one end of the first side (side in the Y direction), that is, to the high-potential control terminals 23. As such, extension of the lead frame 12 with the VCC control terminal to the high-potential control terminals 23 can connect, through the wire 15, the VCC control terminal to the three boot strap diodes 5 corresponding to the U-phase, the V-phase, and the W-phase.

Connecting the lead frame 12 unified with the VCC control terminal to the three boot strap diodes 5 through the wire 15 can minimize the length of the wire 15. Since the lead frame 12 unified with the VCC control terminal can be connected to the high-voltage IC 3 through the short wire 15, the interconnection of the package 20 can be simplified. Furthermore, disposing the VCC control terminal in the first low-potential control terminals 24 electrically connected to the high-voltage IC 3, in the other end of the first side (side in the Y direction) in the package 20 can simplify the interconnection of the package 20.

The dummy terminal 31 is disposed at the other end portion of the lead frame 12 to which the VCC control terminal is connected. The dummy terminal 31 protrudes from the third side (side in the X direction) of the package 20. An amount of protrusion of the dummy terminal 31 from the third side (side in the X direction) is smaller than that of the VCC control terminal from the first side (side in the Y direction). Here, the lead frame 12 corresponds to a first lead frame.

When the three boot strap diodes 5 are connected to the lead frame 12 unified with the VCC control terminal, the VCC control terminal needs to be disposed near the high-potential control terminals 23. However, the high-potential control terminals 23 need to ensure insulation distances with other terminals, disposing the VCC control terminal in the high-potential control terminals 23 is not preferable.

On the other hand, when the VCC control terminal is separated from the high-potential control terminals 23, the interconnection of the package 20 is increased. Mere extension of the lead frame 12 with the VCC control terminal toward the high-potential control terminals 23 for reducing the interconnection of the package 20 causes concern about reducing the rigidity of the VCC control terminal and a misalignment of the VCC control terminal. Here, protruding the other end portion of the lead frame 12 to which the VCC control terminal is connected from the third side (side in the X direction) as the dummy terminal 31 can facilitate positioning the VCC control terminal and ensuring the insulation distances with the high-potential control terminals 23.

Figure 2:
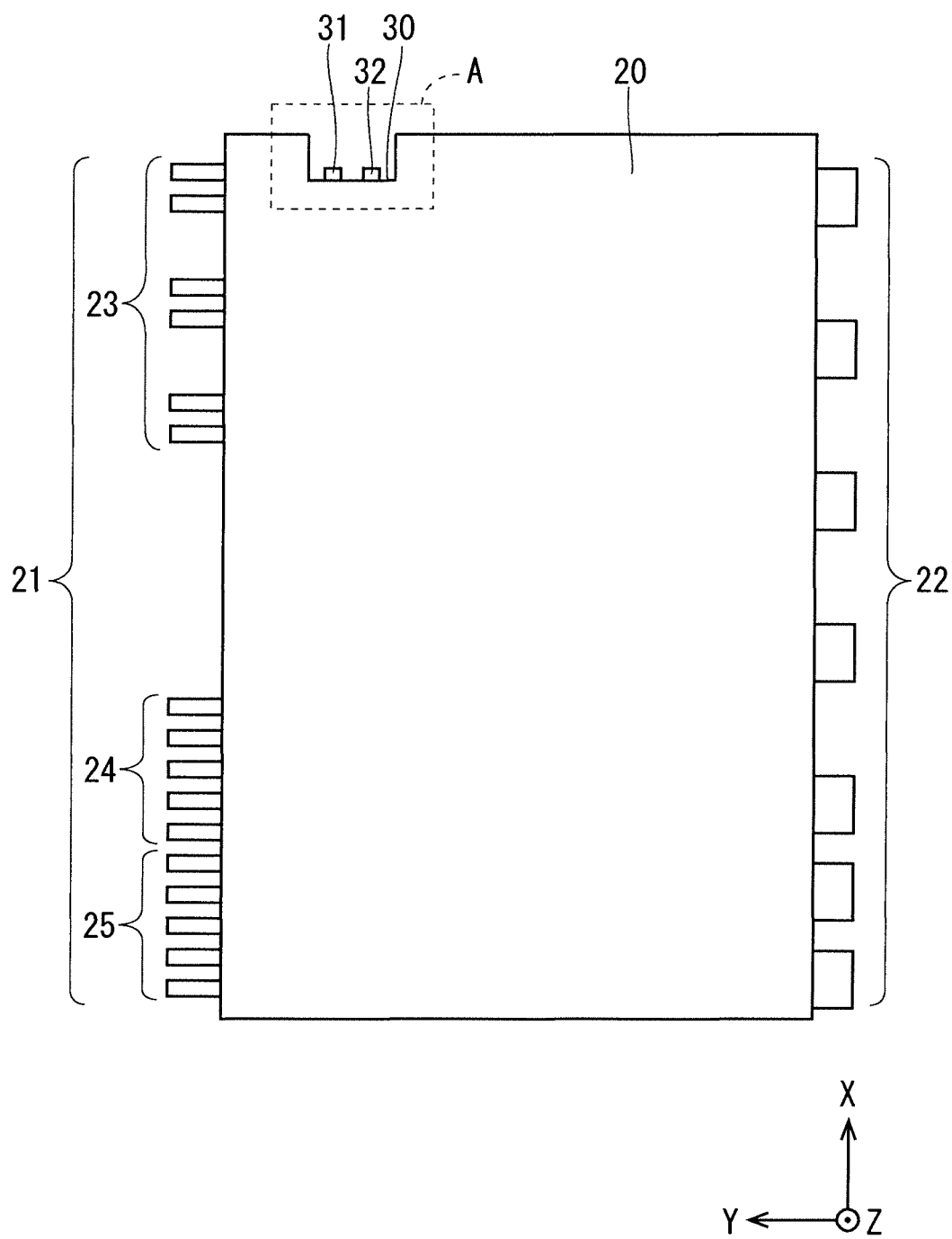
FIG. 2 is a top view of the semiconductor device according to the embodiment.

In FIG. 1, only the lead frame 12 with the VCC control terminal protrudes as the dummy terminal. However, the lead frame 13 to which the GND control terminal is connected and on which the high-voltage IC 3 and the low-voltage IC 4 are mounted may protrude as a dummy terminal 32 from the third side (the X direction) of the package 20 as illustrated in FIG. 2. The lead frame 13 extends to the high-potential control terminals 23, that is, to the one end of the first side (side in the Y direction). This can also simplify the interconnection of the package 20, and facilitate positioning the GND control terminal. Here, the lead frame 13 corresponds to the first lead frame.

Since the boot strap diodes 5 are disposed inside the package 20, the semiconductor device need not be externally equipped with the boot strap diodes 5. Thus, a system including the semiconductor device can be downsized.

Figure 3:
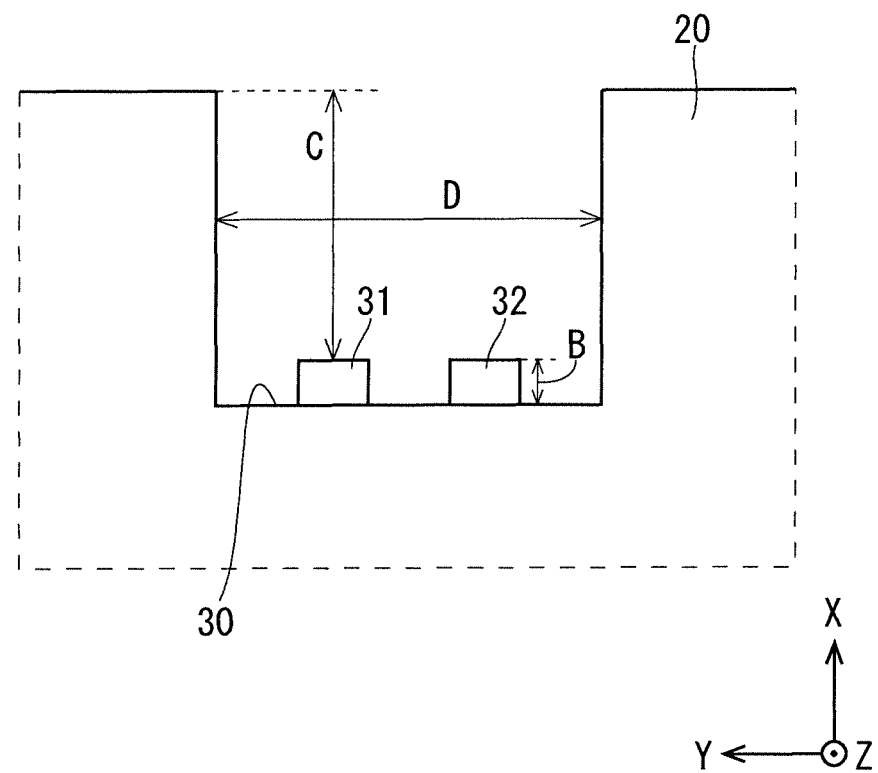
FIG. 3 is an enlarged view of a region A in FIG. 2.
Figure 4:
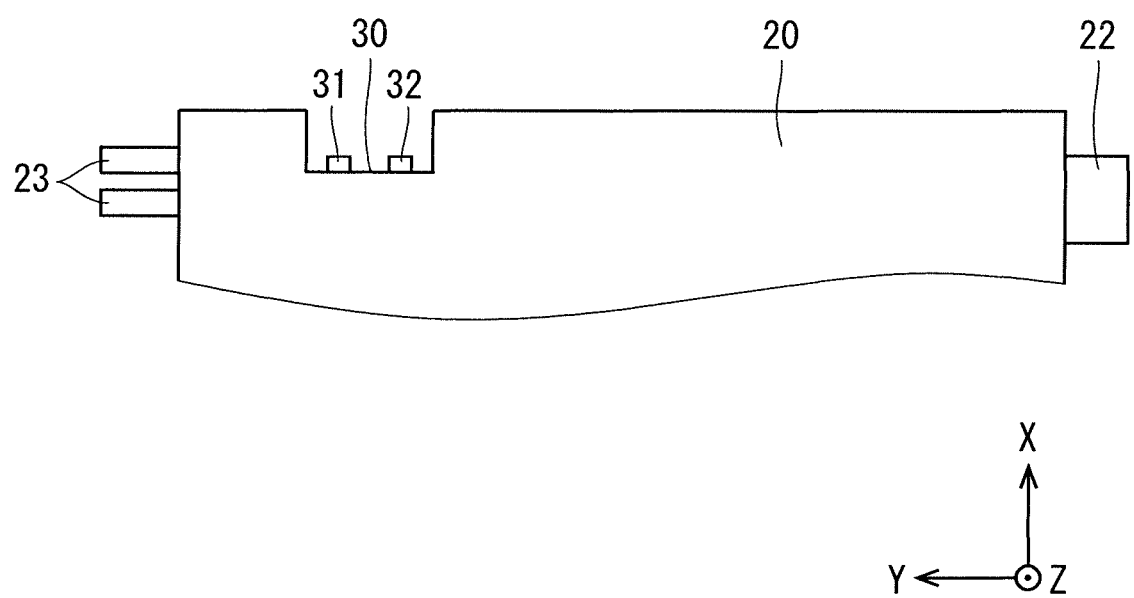
FIG. 4 is an enlarged view around the third side of the semiconductor device according to the embodiment.

Next, a structure around the dummy terminal 31 will be described with reference to FIGS. 2 to 4. FIG. 2 is a top view of the semiconductor device according to the embodiment. FIG. 3 is an enlarged view of a region A in FIG. 2. FIG. 4 is an enlarged view around the third side of the semiconductor device according to the embodiment. FIG. 2 illustrates, in addition to the dummy terminal 31, that the lead frame 13 to which the GND control terminal is connected protrudes from the third side (side in the X direction) of the package 20 as the dummy terminal 32.

As illustrated in FIGS. 2 and 3, the third side (side in the X direction) of the package 20 closer to the first side (side in the Y direction) includes a recessed portion 30 that is recessed toward the fourth side (side in the -X direction). The dummy terminals 31 and 32 protrude from the recessed portion 30. There is no restraint on the number and the type of terminals disposed in the recessed portion 30. An amount of protrusion B of each of the dummy terminals 31 and 32 from the recessed portion 30 is smaller than or equal to 0.75 mm. Even when the surrounding area of the recessed portion 30 in the package 20 is grasped by either hand, this structure ensures sufficient distances between the hand and the dummy terminals 31 and 32. Thus, when the semiconductor device is mounted by the hands, the hands hardly come in contact with the dummy terminals 31 and 32.

The recessed portion 30 has a width D smaller than or equal to 5 mm. A distance C from the end face of the third side (side in the X direction) of the package 20 to the dummy terminals 31 and 32 is larger than or equal to 1 mm. Even when the surrounding area of the recessed portion 30 in the package 20 is grasped by either hand, forming the recessed portion 30 in such a shape can further prevent the hand from coming in contact with the dummy terminals 31 and 32.

As illustrated in FIGS. 2 and 4, the recessed portion 30 is formed closer to the first side (side in the Y direction) than to the second side (side in the -Y direction) of the package 20. Since this increases the surrounding area of the recessed portion 30 in the package 20 which can be grasped by the hand, this contributes to an increase in the working efficiency.

The dummy terminal 31 is electrically connected to electrodes except gate electrodes of the power chips 1, which is not illustrated. Even if static electricity is applied to the dummy terminal 31, no static electricity is applied to the gate electrodes of the power chips 1 with smaller electrostatic tolerance.

Furthermore, the dummy terminal 32 is disposed at the lead frame 13 unified with the GND control terminal. Even if static electricity is applied to the dummy terminal 32, no static electricity is applied to the power chips 1, the high-voltage IC 3, and the low-voltage IC 4.

Advantages

As described above, the semiconductor device according to the embodiment includes: a plurality of semiconductor elements; the package 20 sealing the plurality of semiconductor elements, the package 20 being rectangular in a top view; the plurality of control terminals 21 protruding from a first side (side in the Y direction) of the package 20; the plurality of output terminals 22 protruding from a second side (side in the -Y direction) facing the first side (side in the Y direction) of the package 20; and the recessed portion 30 formed in a third side (side in the X direction) adjacent to the first side (side in the Y direction) and the second side (side in the -Y direction) of the package 20, wherein a part of the plurality of control terminals 21 is disposed at end portions of the lead frames 12 and 13, the semiconductor device further includes the dummy terminals 31 and 32 disposed at other end portions of the lead frames 12 and 13, respectively, the dummy terminals 31 and 32 protruding from the recessed portion 30, and an amount of the protrusion of each of the dummy terminals 31 and 32 from the recessed portion 30 is smaller than or equal to 0.75 mm.

Even when the surrounding area of the recessed portion 30 in the package 20 is grasped by either hand, this structure ensures sufficient distances between the hand and the dummy terminals 31 and 32. When the semiconductor device is mounted by the hands, this structure can further prevent the hands from coming in contact with the dummy terminals 31 and 32, and prevent static electricity from being applied to the dummy terminals 31 and 32.

Moreover, the recessed portion 30 has a width smaller than or equal to 5 mm. A distance from the end face of the third side (side in the X direction) of the package 20 to the dummy terminals 31 and 32 is larger than or equal to 1 mm. Even when the surrounding area of the recessed portion 30 in the package 20 is grasped by either hand, this structure can further prevent the hands from coming in contact with the dummy terminals 31 and 32, and prevent static electricity from being applied to the dummy terminals 31 and 32.

The semiconductor device further includes the low-voltage IC 4 and the high-voltage IC 3 that control the plurality of semiconductor elements, wherein the high-voltage IC 3 receives a voltage higher than a voltage received by the low-voltage IC 4. Thus, mounting the low-voltage IC 4 and the high-voltage IC 3 inside the package 20 can reduce an area of a substrate on which the semiconductor device is to be mounted.

The plurality of control terminals 21 include: the high-potential control terminal 23 electrically connected to the high-voltage IC 3; the first low-potential control terminal 24 electrically connected to the high-voltage IC 3 and receiving a voltage lower than a voltage of the high-potential control terminal 23; and the second low-potential control terminal 25 electrically connected to the low-voltage IC 4 or electrically connected to neither the high-voltage IC 3 nor the low-voltage IC 4, and the high-potential control terminal 23, the first low-potential control terminal 24, and the second low-potential control terminal 25 are disposed on the first side (side in the Y direction) of the package 20 in this order.

Since this structure can facilitate ensuring insulation distances between the high-potential control terminals 23, the first low-potential control terminals 24, and the second low-potential control terminals 25, the semiconductor device can be downsized.

The high-potential control terminal 23 is disposed at one end portion of the lead frame 11, the plurality of semiconductor elements include the boot strap diode 5 mounted on the lead frame 11, and the boot strap diode 5 is electrically connected to the dummy terminal 31.

Connecting the lead frame 12 unified with the VCC control terminal to the three boot strap diodes 5 through the wire 15 can minimize the length of the wire 15. This can simplify the interconnection of the package 20.

The GND control terminal in the first low-potential control terminals 24 is disposed at the one end portion of the lead frame 13 on which the low-voltage IC 4 and the high-voltage IC 3 are mounted, and the dummy terminal 32 is disposed at the other end portion of the lead frame 13. Even if static electricity is applied to the dummy terminal 32, no static electricity is applied to the power chips 1, the high-voltage IC 3, and the low-voltage IC 4. This can further prevent static electricity from incurring a risk of failure in the semiconductor device.

The plurality of semiconductor elements include a switching element, and the dummy terminal 31 is electrically connected to at least one electrode except a gate electrode of the switching element. Even if static electricity is applied to the dummy terminal 31, no static electricity is applied to the gate electrodes of the power chips 1 with smaller electrostatic tolerance. Since this can narrow down target elements for which measures against static electricity should be taken to the high-voltage IC 3 and the low-voltage IC 4, the cost for the measures can be reduced.

The recessed portion 30 is formed closer to the first side than (side in the Y direction) to the second side (side in the −Y direction) of the package 20. Since this increases the surrounding area of the recessed portion 30 in the package 20 which can be grasped by the hand, this contributes to an increase in the working efficiency.

The plurality of semiconductor elements contain a wide bandgap semiconductor as a semiconductor material. Since the semiconductor elements containing the wide bandgap semiconductor are high in voltage withstanding performance and allowable current density, the semiconductor elements can be downsized. This can downsize the semiconductor device. Furthermore, this contributes to an increase in heat resistance performance of the semiconductor device. Thus, radiating fins of a heat sink to be attached to the semiconductor device can be downsized. This also reduces the power loss of the semiconductor elements, which can increase the efficiency of the semiconductor elements and even the efficiency of the semiconductor device. Although it is preferred that both of the switching elements and the diode elements in the semiconductor elements contain wide bandgap semiconductors, one of the switching elements and the diode elements may contain a wide bandgap semiconductor. This can also produce the same advantages as described above.

Modifications of Embodiment

Modifications of the embodiment will be described next.

A dummy terminal may be disposed in the lead frame 11 unified with the UP control terminal, the VP control terminal, or the WP control terminal that is a control power terminal, which is not illustrated. Control power units of the power chips 1 generally have high electrostatic tolerance. Even if static electricity is applied to the dummy terminal, the semiconductor device can further prevent static electricity from incurring a risk of failure.

The recessed portion 30 may be sealed by a resin, which is not illustrated. This can further prevent the hands from coming in contact with the dummy terminals 31 and 32, and prevent static electricity from being applied to the dummy terminals 31 and 32.

Although a structure in which the semiconductor elements are mounted on the lead frames is described in the embodiment, the internal structure of the package 20 is arbitrarily changeable. The semiconductor elements may have a structure of being bonded to an insulating substrate, which is not illustrated. Here, the insulating substrate has a structure including a first metal layer with one principal surface on which the semiconductor elements are mounted, and an insulating layer bonded to the other principal surface of the first metal layer. The output terminals 22 have a structure of being bonded to the first metal layer by ultrasonic bonding or solder.

Although a structure in which the power chips 1 such as IGBTs and the diodes 2 are mounted as separate components is described in the embodiment, the structure is not limited to this. The plurality of semiconductor elements may be, for example, semiconductor elements each including one semiconductor substrate on which an IGBT region and a diode region are formed, that is, semiconductor elements each including a reverse conducting insulated gate bipolar transistor (RC-IGBT), which is not illustrated. Since these semiconductor elements can be downsized more than the power chips 1 and the diodes 2 mounted as separate components, the semiconductor device can be downsized.

Although a structure in which the lead frames include a terminal portion protruding from the package 20 and a die bonding portion on which the semiconductor elements are mounted is described in the embodiment, the die bonding portion may have an insulating substrate structure. In FIG. 1, the lead frames 10 on which the power chips 1 and the diodes 2 are mounted can be replaced with an insulating substrate. The insulating substrate should have a structure including an insulating layer in the middle, and metal layers on both sides of the insulating layer. The metal layers have a structure insulated by the insulating layer. Here, the semiconductor elements are mounted on one of the metal layers. The terminal portion should be electrically connected to the metal layers inside the package 20 by, for example, solder, ultrasonic vibration, or the wire 15. When the lead frames or the insulating substrate is used as the die bonding portion, there is no change in the arrangement relationship between the control terminals 21 and the dummy terminals 31 and 32.

The embodiment can be appropriately modified.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a plurality of semiconductor elements;
   a package sealing the plurality of semiconductor elements, the package being rectangular in a top view;
   a plurality of control terminals protruding from a first side of the package;
   a plurality of output terminals protruding from a second side facing the first side of the package; and
   a recessed portion formed in a third side adjacent to the first side and the second side of the package,
   wherein a part of the plurality of control terminals is disposed at one end portion of a first lead frame,
   the semiconductor device further comprises a dummy terminal disposed at an other end portion of the first lead frame, the dummy terminal protruding from the recessed portion,
   an amount of the protrusion of the dummy terminal from the recessed portion is smaller than or equal to 0.75 mm,
   the recessed portion has a width smaller than or equal to 5 mm, and
   a distance from an end face of the third side of the package to the dummy terminal is larger than or equal to 1 mm.

2. The semiconductor device according to claim 1, further comprising
   a low-voltage integrated circuit and a high-voltage integrated circuit that control the plurality of semiconductor elements,
   wherein the high-voltage integrated circuit receives a voltage higher than a voltage received by the low-voltage integrated circuit.

3. The semiconductor device according to claim 2,
   wherein the plurality of control terminals include: a high-potential control terminal electrically connected to the high-voltage integrated circuit; a first low-potential control terminal electrically connected to the high-voltage integrated circuit and receiving a voltage lower than a voltage of the high-potential control terminal; and a second low-potential control terminal electrically connected to the low-voltage integrated circuit or electrically connected to neither the high-voltage integrated circuit nor the low-voltage integrated circuit, and
   the high-potential control terminal, the first low-potential control terminal, and the second low-potential control terminal are disposed on the first side of the package in this order.

4. The semiconductor device according to claim 3,
   wherein the high-potential control terminal is disposed at one end portion of a second lead frame,
   the plurality of semiconductor elements include a boot strap diode mounted on the second lead frame, and
   the boot strap diode is electrically connected to the dummy terminal.

5. The semiconductor device according to claim 3,
   wherein the first low-potential control terminal is disposed at the one end portion of the first lead frame on which the low-voltage integrated circuit and the high-voltage integrated circuit are mounted, and
   the dummy terminal is disposed at the other end portion of the first lead frame.

6. The semiconductor device according to claim 1,
   wherein the plurality of semiconductor elements include a switching element, and
   the dummy terminal is electrically connected to at least one electrode except a gate electrode of the switching element.

7. The semiconductor device according to claim 1,
   wherein the recessed portion is formed closer to the first side than to the second side of the package.

8. The semiconductor device according to claim 1,
   wherein the recessed portion is sealed by a resin.

9. The semiconductor device according to claim 1,
   wherein the plurality of semiconductor elements contain a wide bandgap semiconductor as a semiconductor material.

10. The semiconductor device according to claim 1,
    wherein the plurality of semiconductor elements include a reverse conducting insulated gate bipolar transistor.

* * * * *